US006313685B1

(12) United States Patent
Rabii

(10) Patent No.: US 6,313,685 B1
(45) Date of Patent: Nov. 6, 2001

(54) OFFSET CANCELLED INTEGRATOR

(75) Inventor: Shahriar Rabii, Stanford, CA (US)

(73) Assignee: Level One Communications, Inc., Sacremento, CA (US)

( * ) Notice: Subject to any disclaimer, the term of this patent is extended or adjusted under 35 U.S.C. 154(b) by 0 days.

(21) Appl. No.: 09/543,181

(22) Filed: Apr. 5, 2000

Related U.S. Application Data

(60) Provisional application No. 60/135,477, filed on May 24, 1999.

(51) Int. Cl.[7] ................................ H03L 5/00; G06G 7/64

(52) U.S. Cl. ............................................ 327/307; 327/341

(58) Field of Search .................................... 327/307, 336, 327/337, 362, 345, 355–361, 554, 91, 94–96, 341; 330/9

(56) References Cited

U.S. PATENT DOCUMENTS 4,697,152 * 9/1987 Westwick ................................ 330/9
5,276,367 * 1/1994 Shibatani et al. .................... 327/362
5,648,738 * 7/1997 Welland et al. ..................... 327/307
5,798,664 * 8/1998 Nagahori et al. .................... 327/307
6,166,581 * 12/2000 Liu et al. ............................ 327/337

* cited by examiner

*Primary Examiner*—Toan Tran
(74) *Attorney, Agent, or Firm*—Merchant & Gould P.C.

(57) ABSTRACT

An offset integrator and method are provided to induce integrator leakage while simultaneously latching and canceling its own offset. The method includes combining a first and second input signals with a part of the output signal of a different polarity to produce a charge signal. An accumulation of the charge signal on a plurality of storage components is used to reduce the offset component of the output signal and simultaneously inducing an integrator leak. A positive and negative components of the input signals are combined with a negative and positive offset components of the part of the output signal, respectively. The method liner includes modifying a positive and negative components of an in-phase and a quadrature signal. A reset signal may be provided to erase a plurality of memory locations. A gating scheme may be used to provide a predetermined signal to produce a two-phase, non-overlapping signal. The two-phase non-overlapping signal also produces a predetermined delayed two-phase, non-overlapping signal. The gating scheme provides proper timing signals without the use of complementary clock phases.

15 Claims, 4 Drawing Sheets

OFFSET CANCELLED INTEGRATOR

RELATED APPLICATION

This application claims the benefit of Provisional Application, U.S. Ser. No. 60/135,477, filed on May 24, 1999, entitled to "OFFSET CANCELLED INTEGRATOR", by Shahriar Rabii.

BACKGROUND OF THE INVENTION

1. Field of the Invention

This invention relates in general to signal processing, and more particularly to an integrator circuit that achieves offset reduction while inducing integrator leakage.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, comparators, demodulators, filters, amplifiers, and integrators.

One important aspect of digital radio personal communications devices is the integration of Radio Frequency (RF) sections of transceivers. Compared to other types of integrated circuits, the level of integration in the RF sections of transceivers is still relatively low. Considerations of power dissipation, low offset budgets, form factor, and cost dictate that the RF/IF portions of these devices evolve to higher levels of integration than at present. Nevertheless, there are some essential barriers to realizing these higher levels of integration.

For example, most applications provide an integrator circuit in a RF receiver system to produce a ramping of an output voltage which is linearly increasing or decreasing. For integrator circuits, low frequency amplifier noises and direct current (DC) offsets are attenuated.

A modification to a typical integrator circuit is necessary to make offset reduction practical. Generally, a capacitor used in an integrator circuit is open to DC signals. As a result, there is no negative feedback, i.e. integrator leakage, at zero frequency. Without a negative feedback, an integrator circuit interprets a DC offset voltage as a valid input voltage. The result is that the capacitor is charged, and the output voltage goes into positive or negative saturation where the output voltage stays indefinitely.

One way of reducing the effect of a DC offset in an input voltage, i.e. inducing integrator leakage, is to place a switched-capacitor in parallel to an integration capacitor, thereby removing some charge every clock cycle. However, this method would often affect the offset cancellation performance. Further, adding a switched-capacitor on chip would increase the size of a chip which is often prohibitive. Off chip switched-capacitor would increase between eight and sixteen extra pins depending on whether one or two sections of AC coupling are needed. In addition, AC coupling would have high enough corner frequency to cause settling at the beginning of a burst which produces too much DC wander for a baseband signal. As a result, a dual bandwidth AC coupling mechanism would have to be utilized.

It can be seen that there is a need for integrator leakage without placing a switched-capacitor in parallel to an integration capacitor.

It can also be seen that there is a need for an offset cancelled integrator that achieves offset reduction while also inducing integrator leak.

SUMMARY OF THE INVENTION

To overcome the limitations in the prior art described above, and to overcome other limitations that will become apparent upon reading and understanding the present specification, the present invention discloses an offset cancelled integrator circuit that achieves offset reduction while also inducing integrator leakage.

The present invention solves the above-described problems by providing an offset cancelled integrator circuit that induces integrator leakage while simultaneously latching and cancelling its own offset voltage via an offset capacitor (Cos).

A method in accordance with the principles of the present invention includes combining a first and second input signals to produce a charge signal, reducing the charge signal using a charge reduction signal, accumulating the reduced charge signal to generate an output signal having an offset component, wherein the output signal is used to produce the charge reduction signal. The output signal is produced via simultaneous accumulation and offset of the charged signal, wherein the offset component is reduced by leaking a fraction of the charge signal.

Other embodiments of a system in accordance with the principles of the invention may include alternative or optional additional aspects. One such aspect of the present invention is that a positive component of the first input signal and a negative component of the second input signal are combined with a negative component and a positive component of the charge reduction signal, respectively, wherein the first and second input signals and the charge reduction signal accumulate on a first storage component, a second storage component, and a third storage component, respectively.

Another aspect of the present invention is that the positive component and the negative component of the input signal further includes subtracting a sum of the first and second positive components of the input signal from the negative component of the charge reduction signal, and subtracting a sum of the first and second negative components of the input signal from the positive component of the charge reduction signal.

A further aspect of the present invention is that the combination of the first and second input signals with a part of the output signal further includes modifying a positive component and a negative component of an in-phase signal and a quadrature signal.

Still another aspect of the present invention is that the accumulation further includes combining the first and second input signals with the charge reduction signal of an opposite polarity via a fourth storage component.

An additional aspect of the present invention is that the reduction of the offset component by leaking the fraction of the charge signal further includes combining the first and second input signals with the charge reduction signal of the opposite polarity via a fifth storage component.

A further another aspect of the present invention is that the accumulating of the reduced charge signal to generate the output signal further includes amplifying the positive component and the negative component of the charge signal.

Still another aspect of the present invention is that a reset signal is provided to erase a plurality of memory locations.

Still an additional aspect of the present invention is to generate a predetermined signal which produces a two-phase non-overlapping signal.

Another aspect of the present invention is that the two-phase, non-overlapping signal further produces a predetermined delayed two-phase non-overlapping signal.

Further, in one embodiment in accordance with the principles of the invention, an offset cancelled integrator circuit for integrating multiple signals includes an arithmetic circuit to combine a first and second input signals to produce a charge signal having an offset, and an offset circuit, coupled to the arithmetic circuit, to reduce the charge signal to produce a reduced charge signal. The charge signal is reduced using a charge reduction signal to leak a fraction of the charge signal and simultaneously accumulate the reduced charge signal to produce an output signal.

Another aspect of the present invention is that the arithmetic circuit includes a plurality of storage components for combining a positive component and a negative component of the input signal with a negative component and a positive component of the charge reduction signal, respectively.

Still another aspect of the present invention is that the storage components further combine the sum of the first and second positive components of the input signal with the negative component of the charge reduction signal, and combine the sum of the first and second negative components of the input signal with the positive component of the charge reduction signal.

A further aspect of the present invention is that the first and second input signals and the charge reduction signal accumulate on a first storage component, a second storage component, and a third storage component, respectively.

An additional aspect of the present invention is that the arithmetic circuit further modifies a positive component and a negative component of an in-phase signal and a quadrature signal.

Still another aspect of the present invention is that the offset circuit further includes a fourth storage component for accumulating the resulting sum of the first and second input signals and the charge reduction signal of an opposite polarity.

Another aspect of the present invention is that the offset circuit ether includes a fifth storage component for leaking a fraction of the charge signal by combining the resulting sum of the first and second input signals and the charge reduction signal of an opposite polarity.

A further aspect of the present invention is that the storage component further includes a capacitor for storing a positive component and a negative component of a signal.

An additional aspect of the present invention is that the offset circuit includes a reset circuit for providing a reset signal to erase a plurality of memory locations.

Still another aspect of the present invention is the generation of a predetermined signal wherein the predetermined signal produces a two-phase, non-overlapping signal.

A further aspect of the present invention is that the two-phase non-overlapping signal further produces a predetermined delayed two-phase non-overlapping signal.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which it is shown by way of illustration the specific embodiment in which the invention may be practiced. It is to be understood that other embodiments may be utilized as structural changes may be made without departing from the scope of the present invention.

The primary design issues of an integrator circuit such as the offset cancelled integrator circuit is to achieve offset reduction while also inducing integrator leakage. The present invention scales and adds two inputs, via a first storage component ($C_1$) and second storage component ($C_2$), while simultaneously subtracting a portion of its previous output via a third storage component ($C_3$). Then, a resulting charge is accumulated on a fourth storage component ($C_4$). The accumulation is performed while an offset voltage is simultaneously latched and cancelled via a fifth storage component, Cos. The negative components of the storage devices, i.e. $C_{1n}$ through $C_{4n}$ and $Cos_n$, are performed in a similar manner. It is appreciated that those skilled in the art would realize that a capacitor may be used as a storage component in this embodiment, and that other suitable storage components may also be used. The formula for the resulting output of the integrator is:

$$V_{out}(z)=(a_1\ V_{i1}(z)+a_2V_{i2}(z))\ (z^{-1}/(1-Pz^{-1})) \qquad [1]$$

where the integrator gains are $a_1=C_1/C_4$ and $a_2=C_2/C_4$, and the leakage factor is $P=(C_4-C_1)C_4$.

In a Time Division Duplex (TDD) transceiver system, a transmitter and a receiver are not on simultaneously. Typically, when the transmitter is on, the receiver is off. Likewise, when the receiver is on, the transmitter is off. In operation, data is bursted by the transmitter at a rate different from the continuous data received by the receiver. For example, the data bursted by the transmitter may be more than twice the rate of the continuous receiving data. A far end receiver stores up the bursted data to be read out of a memory at a slower continuous pace. A transmission medium typically introduces DC offset voltages. A DC offset cancelled integrator circuit is designed to reduce the DC offset while inducing integrator leak.

Figure 1:
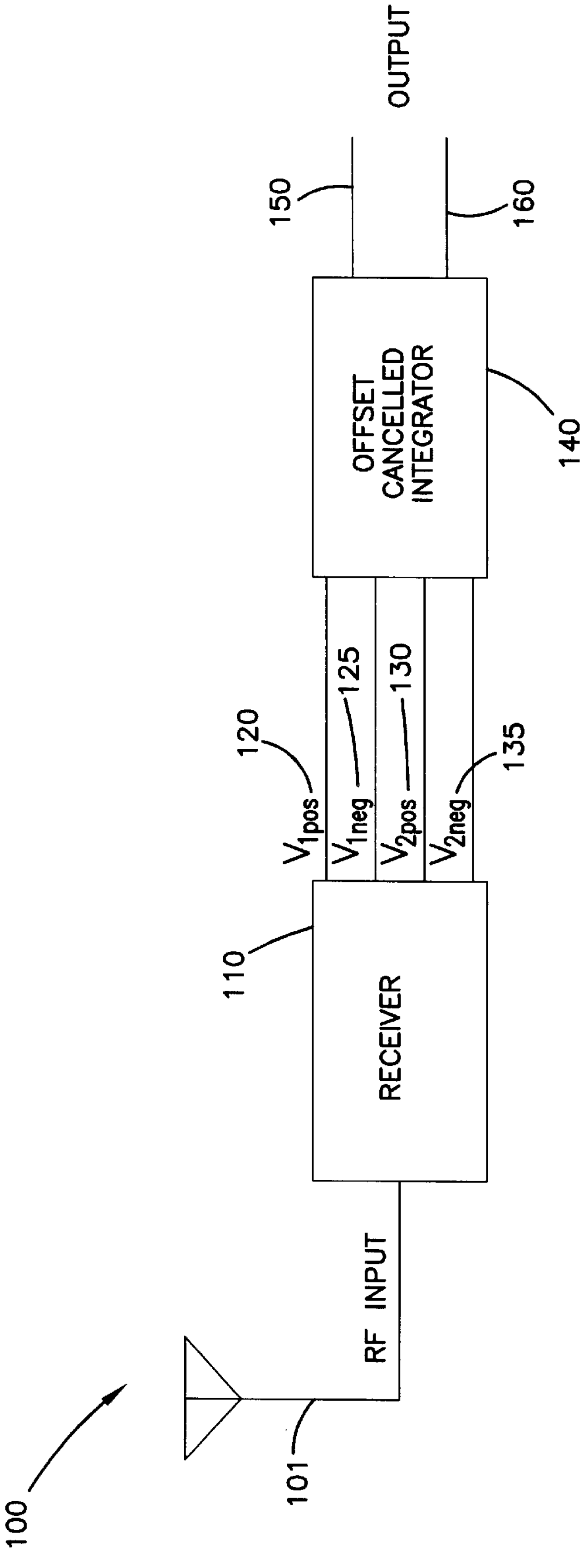
FIG. 1 is an exemplary diagram illustrating one embodiment of an offset cancelled integrator in a radio receiver system in accordance with the principles of the present invention.

FIG. 1 is a diagram illustrating one embodiment of an offset cancelled integrator 140 in a radio receiver system 100 in accordance with the principles of the present invention. An RF signal is received by an antenna 101 and is routed to a receiver system 110. Outputs from the receiver system 110 are input signals $V_{1pos}$ 120, $V_{1neg}$ 125, $V_{2pos}$ and $V_{2neg}$ 135 to the offset cancelled integrator 140. The output of the integrator 140 is an offset reduced signal 150, 160.

Figure 2:
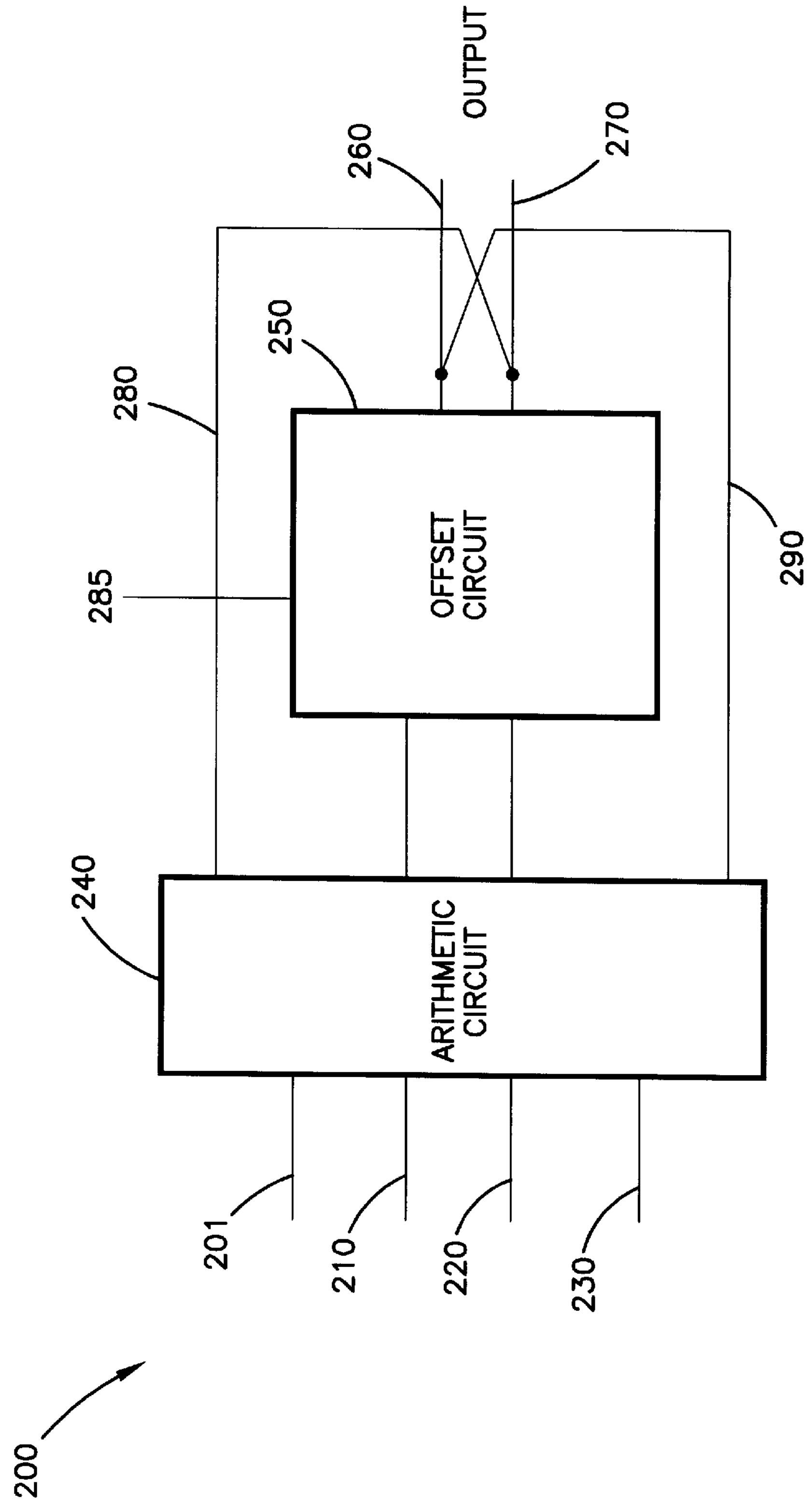
FIG. 2 is a block diagram of one embodiment of the offset cancelled integrator circuit in accordance with the principles of the present invention.

FIG. 2 is a block diagram of an offset integrator circuit 200 according to the principles of the present invention. The circuit 200 is preferably a correlated double sampling (CDS) integrator circuit which attenuates a low frequency amplifier noise including 1/f (1/frequency) and DC offset, and provides an output as described in equation [1] above.

To preserve the correlated double sampling while inducing integrator leak, a portion of the integrator memory is subtracted in every clock cycle by feeding the output back to the inputs with reverse polarity. The output is sampled during phase Φ1 for the offset reduction to be active.

In FIG. 2, the inputs 201, 210, 220, 230 are modified in an arithmetic circuit 240. The arithmetic circuit 240 scales and adds a pair of the inputs at a time while subtracting a portion of a previous output 260, 270 of the integrator 200. Then, a resulting charge is accumulated on integration capacitors of an offset circuit 250. The offset circuit 250 performs the integration while simultaneously latching and cancelling its own offset voltage. The resulting output 260, 270 of the integrator 200 is transferred to a subsequent digital processing circuitry (not shown). The feedback lines 280, 290 deliver a portion of the output signal 260, 270 in a reverse polarity to the arithmetic circuit 240. The feed back signals are then combined with the inputs which were previously scaled and added in the arithmetic circuit 240. The resulting signal is an offset reduced output signal 260, 270.

In addition, the integrator circuit 200 may provide a reset signal 285 which can be implemented as a CMOS transmission gate. The CMOS transmission gate shunts an amplifier feedback capacitor and erases an integrator memory when the reset signal 285 becomes active. Capacitors in a feedback loop (in FIG. 3) can act as a high pass filter and require much less total capacitance than standard AC coupling. The capacitors in the feedback loop can be directed to hold, and once they are settled, they do not contribute to a signal induced DC wander.

Figure 3:
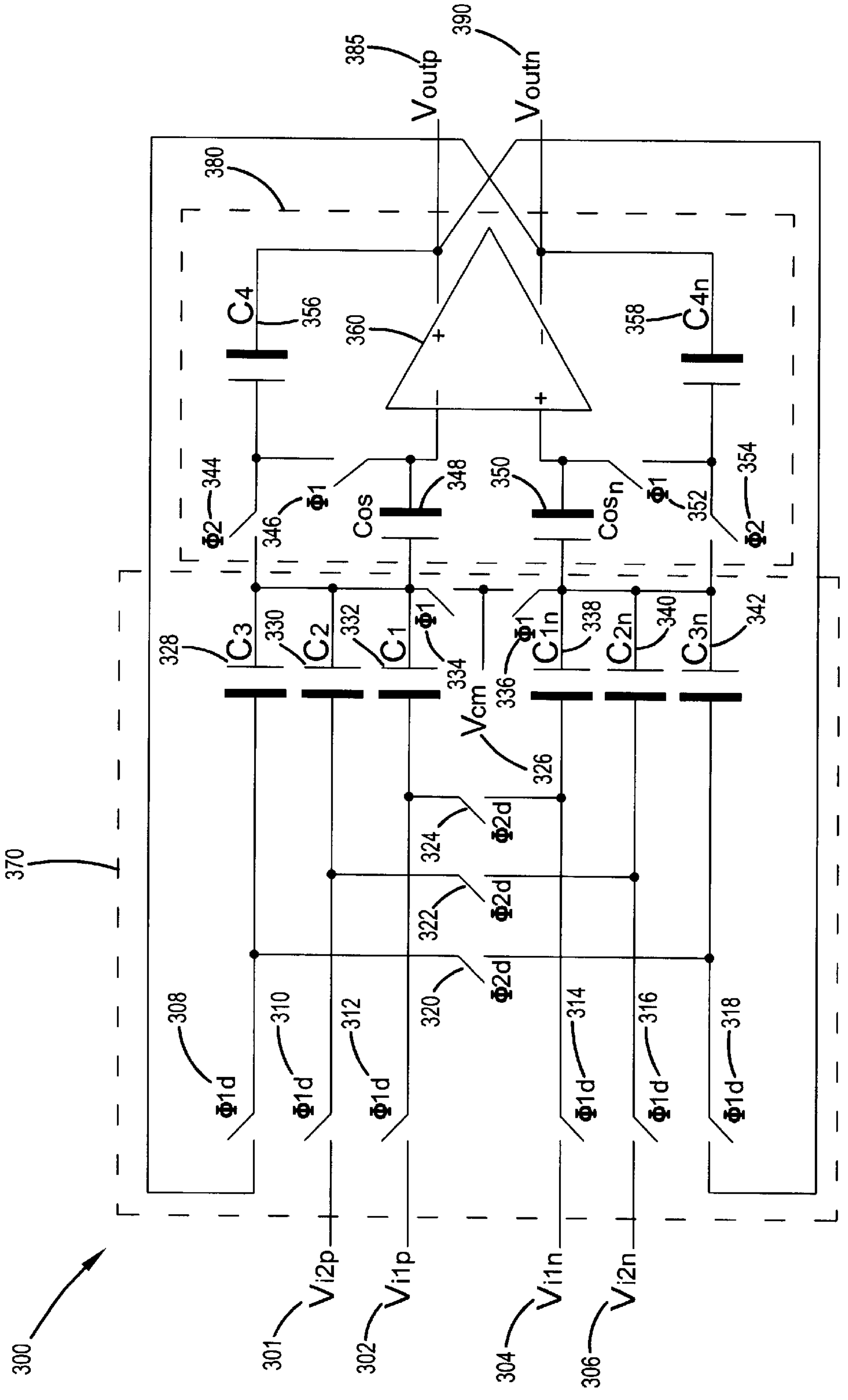
FIG. 3 is a detailed diagram of one embodiment of the offset cancelled integrator circuit in accordance with the principles of the present invention.

In FIG. 3, one embodiment of the offset cancelled integrator circuit 300 according to the present invention is illustrated in more details. The circuit 300 scales and adds two positive inputs $V_{i1p}$ 302 and $V_{i2p}$ 301 and two negative inputs $V_{i1n}$ 304 and $V_{i2n}$ 306. This is accomplished in an arithmetic circuit 370 via a first storage component, $C_1$ 332 and a second storage component, $C_2$ 330, for the positive inputs, and via a first storage component, $C_{1n}$ 338 and a second storage component, $C_{2n}$ 340, for the negative inputs, while also subtracting a portion of its previous output via a third storage component, $C_3$ 328 and $C_{3n}$ 342, respectively. In an offset circuit 380, an accumulation of the resulting charge on a fourth storage component, i.e. an integration capacitor, $C_4$ 356 and $C_{4n}$ 358, respectively. The accumulation is performed while simultaneously latching and reducing its own offset voltage via a fifth storage component, i.e. an offset capacitor, Cos 348 and $Cos_n$ 350, respectively.

A non-linear circuit 360 modifies the accumulated charges on the integrator capacitors $C_4$ and $C_{4n}$ to provide resulting outputs $V_{outp}$, $V_{outn}$ 385, 390 of the integrator circuit 300 as shown above in equation [1].

The characteristic of the integrator circuit 300 is that it achieves offset reduction while also inducing integrator leak.

It is appreciated that those skilled in the art will realize that the reset signal 285 shown in FIG. 2 is not shown in the circuit 300, and that a reset circuit can be implemented in FIG. 3 as a CMOS transmission gate that shunts the amplifier feedback capacitor and erases an integrator memory when the reset signal becomes active.

To those skilled in the art, the integrated circuit 300 may be used with, but not limited to, any operational amplifier that is capable of driving a capacitive load. A well-known clocking scheme, two-phase, non-overlapping clocking scheme, can be used, wherein phase 1 (Φ1) switches 334, 336, 346, 352 and phase 2 (Φ2) switches 344, 354 are non-overlapping clock phases, and phase 1*d* (Φ1*d*) switches 308, 310, 312, 314, 316, 318 and phase 2*d* (Φ2*d*) switches 320, 322, 324 are slightly delayed versions of the phases 1 and 2 (Φ1, Φ2) clocks, respectively. The use of NMOS switches has been assumed here. It is appreciated that PMOS or CMOS can be used within the scope of the present invention. The integrator circuit 300 can be implemented using CMOS switches but would require complementary clock phases. It is appreciated that those skilled in the art will realize that the NMOS, PMOS, and CMOS switches are exemplary embodiments and that other switches may be used.

A common-mode voltage, Vcm, of the input signals and a common-mode voltage of the output signals may be different. This is due to the common-mode voltage cancellation that is provided by the switches that operate on clock phase 2*d* (Φ2*d*). The common-mode voltage at the amplifier's input is determined by Vcm.

Figure 4:
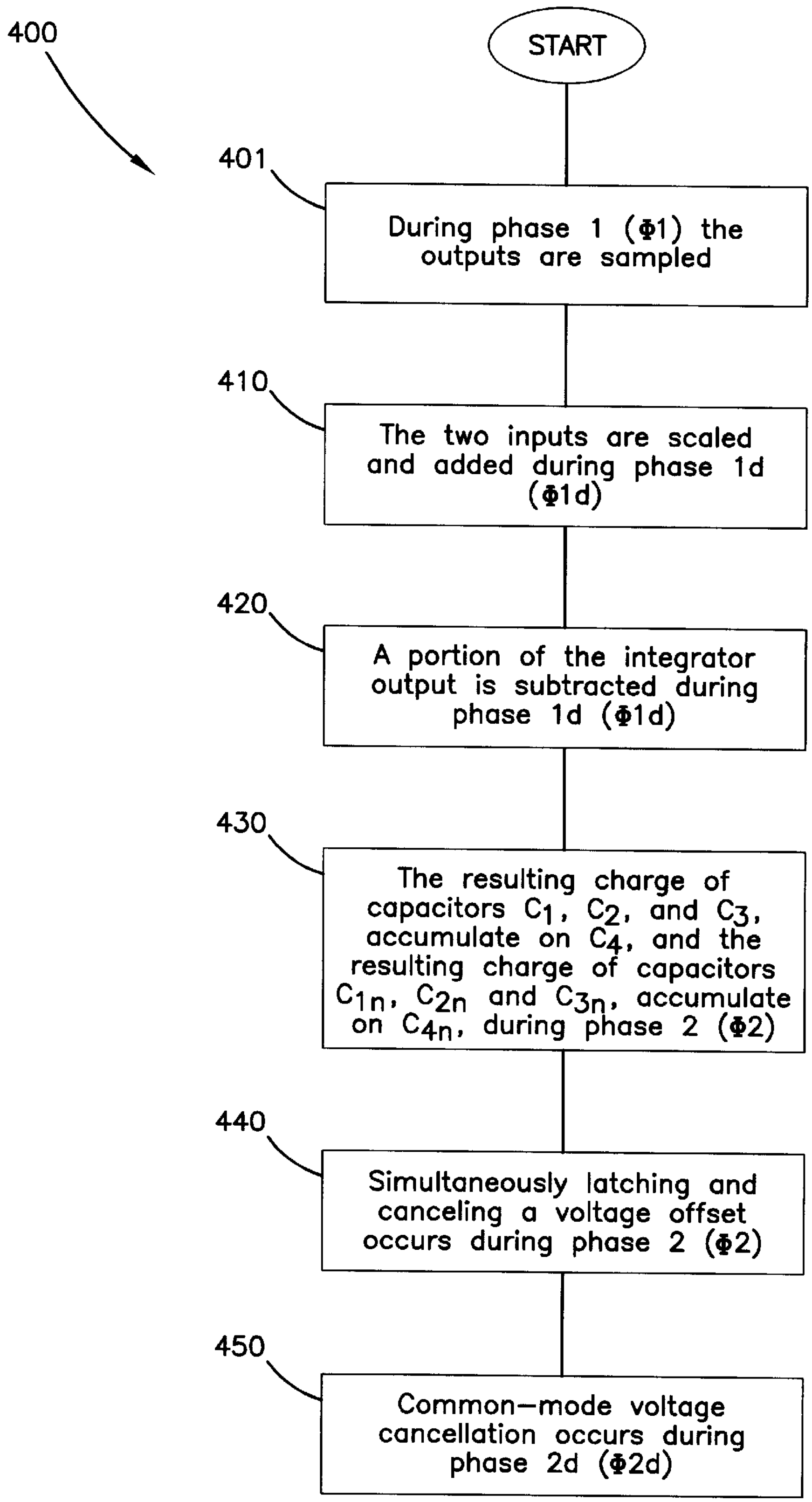
FIG. 4 is a flow diagram illustrating a phase transition through one embodiment of the offset cancelled integrator in accordance with the principles of the present invention.

FIG. 4 illustrates an operational flow 400 of a phase transition through one embodiment of an offset cancelled integrator according to the present invention. A two phase, non-overlapping clocking scheme is provided wherein phase 1 (Φ1) and phase 2 (Φ2) are non-overlapping clock phases and phase 1*d* (Φ1*d*) and phase 2*d* (Φ2*d*) are slightly delayed version of these clocks, respectively.

During phase 1 (Φ1) of a clock cycle, the outputs are sampled in operation 401. During phase 2 (Φ2), the inputs are scaled and added together in operation 410. Further, during phase 1*d* (Φ1*d*), a portion of the outputs is fed back and combined with the sum of the input signals. This portion of the output signals has a reversed polarity of the input signals wherein it is subtracted from the input signals in operation 420. The resulting charge of the combined signals accumulates on the integration capacitor in operation 430. While the accumulation is occurring, the integration circuit simultaneously latches and cancels its own offset via an offset capacitor in operation 440. The operation 440 is accomplished during phase 2 (Φ2). During phase 2*d* (Φ2*d*), common mode voltage cancellations are performed in operation 450. The common mode voltage cancellation is provided by switches that operate during phase 2*d* (Φ2*d*). The common mode voltage of the input signals and the common mode voltage of the output signals may be different. The common mode voltage at the amplifiers input is determined by common mode voltage (Vcm).

The foregoing description of the exemplary embodiment of the invention has been presented for the purposes of illustration and description. It is not intended to be exhaustive or to limit the invention to the precise form disclosed.

Many modifications and variations are possible in light of the above teaching. It is intended that the scope of the invention be limited not with this detailed description, but rather by the claims appended hereto.

What is claimed is:

1. An offset cancelled integrator circuit, comprising:

an arithmetic circuit receiving a plurality of input signals; and an offset circuit having an integrating component and a latching and canceling component, coupled to the arithmetic circuit, generating a plurality of output signals and feeding back the plurality of output signals to the arithmetic circuit, the arithmetic circuit and the offset circuit being arranged and configured to induce integrator leakage by the integrating component while simultaneously latching and canceling an offset voltage by the latching and canceling component.

2. A method of canceling a DC offset in a transceiver system, comprising:

combining a first and second input signals to produce a charge signal; and integrating via an integrating component while simultaneously latching and canceling an offset voltage from the charge signal via a latching and canceling component to generate an output signal.

3. The method of claim 2, wherein the step of integrating while simultaneously latching and canceling an offset voltage from the charge signal includes a step of reducing the charge signal using a charge reduction signal and accumulating the reduced charge signal, and wherein the step of combining includes a step of combining a positive component of the first input signal and a negative component of the second input signal with a negative component and a positive component of the charge reduction signal, respectively, wherein the first and second input signals and the charge reduction signal accumulate on a first storage component, a second storage component, and a third storage component, respectively.

4. The method of claim 3, wherein the reducing includes subtracting a sum of the first and second positive components of the input signal from the negative component of the charge reduction signal, and subtracting a sum of the first and second negative components of the input signal from the positive component of the charge reduction signal.

5. The method of claim 3, wherein the reducing includes modifying a positive component and a negative component of an in-phase signal and a quadrature signal.

6. The method of claim 3, wherein the reducing includes combining the first and second input signals with the charge reduction signal of an opposite polarity via a fourth storage component.

7. The method of claim 4, wherein the reduction of the offset component by leaking the fraction of the charge signal further includes combining the first and second input signals with the charge reduction signal of the opposite polarity via a fifth storage component.

8. The method of claim 3, wherein the accumulating of the reduced charge signal to generate the output signal further includes amplifying the positive component and the negative component of the charge signal.

9. An offset cancelled integrator circuit in a transceiver system, comprising:

an arithmetic circuit to combine a first and second input signals to produce a charge signal having an offset; and an offset circuit having an integrating component and a latching and canceling component, coupled to the arithmetic circuit, to reduce the charge signal to produce a reduced charge signal, the reduced charge signal being produced by using a charge reduction signal to leak a fraction of the charge signal by the latching and canceling component and simultaneously accumulating the reduced charge signal by the integrating component to produce an output signal.

10. The offset cancelled integrator circuit of claim 9, wherein the arithmetic circuit includes a plurality of storage components for combining a positive component and a negative component of the input signal with a negative component and a positive component of the charge reduction signal, respectively.

11. The offset cancelled integrator circuit of claim 10, wherein the storage components further combine the sum of the first and second positive components of the input signal with the negative component of the charge reduction signal, and combine the sum of the first and second negative components of the input signal with the positive component of the charge reduction signal.

12. The offset cancelled integrator circuit of claim 11, wherein the first and second input signals and the charge reduction signal accumulate on a first storage component, a second storage component, and a third storage component, respectively.

13. The offset cancelled integrator circuit of claim 12, wherein the offset circuit further includes a fourth storage component for accumulating the resulting sum of the first and second input signals and the charge reduction signal of an opposite polarity.

14. The offset cancelled integrator circuit of claim 13, wherein the offset circuit further includes a fifth storage component for leaking a fraction of the charge signal by combining the resulting sum of the first and second input signals and the charge reduction signal of the opposite polarity.

15. The offset cancelled integrator circuit of claim 10, wherein the storage components are capacitors.

* * * * *